United States Patent
Li (10) Patent No.: US 10,797,034 B2
(45) Date of Patent: Oct. 6, 2020

(54) ELECTRONIC DEVICE HAVING INDIVIDUAL WRAPPING OF ELECTRONIC PACKAGE UNITS AND MANUFACTURING METHOD THEREOF

(71) Applicant: GIO Optoelectronics Corp, Tainan (TW)

(72) Inventor: Chin-Tang Li, Tainan (TW)

(73) Assignee: GIO OPTOELECTRONICS CORP, Tainan (TW)

(*) Notice: Subject to any disclaimer, the term of this patent is extended or adjusted under 35 U.S.C. 154(b) by 0 days.

(21) Appl. No.: 16/220,610

(22) Filed: Dec. 14, 2018

(65) Prior Publication Data

US 2019/0198490 A1  Jun. 27, 2019

(30) Foreign Application Priority Data

Dec. 22, 2017 (TW) .............................. 106145374 A (51) Int. Cl.
*H01L 25/18* (2006.01)
*H01L 23/31* (2006.01)
(Continued)

(52) U.S. Cl.
CPC ............ *H01L 25/18* (2013.01); *H01L 21/486* (2013.01); *H01L 23/3114* (2013.01);
(Continued)

(58) Field of Classification Search
CPC ..... H01L 25/18; H01L 23/3114; H01L 25/20; H01L 27/124; H01L 23/3121; H01L 33/0095; H01L 21/486; H01L 33/52; H01L 33/62; H01L 24/97; H01L 25/167; H01L 23/31; H01L 27/12; H01L 25/00; H01L 2224/81805; H01L 2224/97;
(Continued)

(56) References Cited

U.S. PATENT DOCUMENTS 7,683,981 B2 * 3/2010 Uemoto ............ G02F 1/133603
349/69
8,368,066 B2 * 2/2013 Yamazaki ........... H01L 27/1225
257/43

(Continued)

*Primary Examiner* — Alexander O Williams
(74) *Attorney, Agent, or Firm* — Muncy, Geissler, Olds & Lowe, P.C.

(57) ABSTRACT

An electronic package unit, a manufacturing method thereof and an electronic device are disclosed. The manufacturing method includes: providing an insulation substrate, wherein the insulation substrate has a first surface and a second surface opposite to the first surface; forming a plurality of sub-matrix circuits on the insulation substrate, wherein each sub-matrix circuit comprises at least one thin film transistor; disposing at least one functional chip on the first surface, wherein the functional chip is electrically connected with the sub-matrix circuit; forming a plurality of through-holes on the insulation substrate and disposing a conductive material in the through-holes, so that the functional chip is electrically connected to the second surface through the sub-matrix circuits and the conductive material; forming a protection layer on the first surface to cover the functional chips; and cutting the insulation substrate and the protection layer to form a plurality of electronic package units.

20 Claims, 10 Drawing Sheets

(51) Int. Cl.
*H01L 25/00* (2006.01)
*H01L 27/12* (2006.01)
*H01L 33/52* (2010.01)
*H01L 33/62* (2010.01)
*H01L 21/48* (2006.01)
*H01L 33/00* (2010.01)
*H01L 25/16* (2006.01)
*H01L 23/00* (2006.01)

(52) U.S. Cl.
CPC .......... *H01L 23/3121* (2013.01); *H01L 25/50* (2013.01); *H01L 27/124* (2013.01); *H01L 33/0095* (2013.01); *H01L 33/52* (2013.01); *H01L 33/62* (2013.01); *H01L 24/97* (2013.01); *H01L 25/167* (2013.01); *H01L 2224/16235* (2013.01); *H01L 2224/16237* (2013.01); *H01L 2224/81205* (2013.01); *H01L 2224/81805* (2013.01); *H01L 2224/81815* (2013.01); *H01L 2224/97* (2013.01); *H01L 2933/005* (2013.01); *H01L 2933/0066* (2013.01)

(58) Field of Classification Search
CPC ....... H01L 2224/81205; H01L 23/5384; H01L 2224/16237; H01L 2924/00014; H01L 2224/81; H01L 2224/81815; H01L 2933/005; H01L 2933/0066; H01L 2224/131; H01L 2224/13144; H01L 2224/16235
USPC ........................................................ 257/678
See application file for complete search history.

(56) References Cited

U.S. PATENT DOCUMENTS

| | | | |
|---|---|---|---|
| 8,541,780 B2 * | 9/2013 | Yamazaki | H01L 29/78606 257/43 |
| 9,478,583 B2 * | 10/2016 | Hu | H01L 27/156 |
| 2007/0196949 A1 | 8/2007 | Lee | |
| 2015/0381121 A1 * | 12/2015 | Jones | H01L 23/047 330/250 |
| 2016/0163765 A1 * | 6/2016 | Hu | H01L 27/156 257/93 |
| 2017/0263828 A1 | 9/2017 | Mao et al. | |
| 2017/0358503 A1 | 12/2017 | Liu et al. | |

* cited by examiner

ELECTRONIC DEVICE HAVING INDIVIDUAL WRAPPING OF ELECTRONIC PACKAGE UNITS AND MANUFACTURING METHOD THEREOF

CROSS REFERENCE TO RELATED APPLICATIONS

This Non-provisional application claims priority under 35 U.S.C. § 119(a) on Patent Application No(s). 106145374 filed in Taiwan, Republic of China on Dec. 22, 2017, the entire contents of which are hereby incorporated by reference.

BACKGROUND

Technology Field

The present disclosure relates to an electronic package unit, a manufacturing method thereof, and an electronic device.

Description of Related Art

In the conventional manufacturing of photovoltaic devices, it is usually to dispose a plurality of thin-film transistors on the substrate to form a TFT (thin-film transistor) substrate, and then the thin-film transistors are used to drive the corresponding photovoltaic components. Taking the organic LED display device as an example, if the design of utilizing the thin-film transistors to drive the organic LEDs to emit light is adopted, the manufacturer must prepare corresponding thin-film processes for different OLED products (with different sizes or functions). Moreover, the thin-film processes may need expensive TFT manufacturing processes, photomasks, substrates, and/or materials, which is not benefit to the requirements for various products, and is lack of flexibility in applications.

SUMMARY

An objective of this disclosure is to provide an electronic package unit, a manufacturing method thereof, and an electronic device. This disclosure does not need to design various manufacturing processes for the products of different sizes and functions. Accordingly, the expensive TFT manufacturing processes, photomasks, substrates, and/or materials are not needed, so that the manufacturing cost can be lower. Besides, this disclosure is flexible and is suitable for the requirements of various products.

To achieve the above objective, the present disclosure provides a manufacturing method of electronic package units. The manufacturing method comprises: providing an insulation substrate, wherein the insulation substrate has a first surface and a second surface opposite to the first surface; forming a plurality of sub-matrix circuits on the insulation substrate, wherein each of the sub-matrix circuits comprises at least one thin film transistor; disposing at least one functional chip on the first surface, wherein the functional chip is electrically connected with the sub-matrix circuit; forming a plurality of through-holes on the insulation substrate and disposing a conductive material in the through-holes, so that the functional chip is electrically connected to the second surface through the sub-matrix circuits and the conductive material; forming a protection layer on the first surface to cover the functional chips; and cutting the insulation substrate and the protection layer to form a plurality of electronic package units.

In one embodiment, the step of forming the through-holes is to provide a laser for irradiating the insulation substrate so as to form the through-holes on the insulation substrate.

In one embodiment, the step of disposing the conductive material in the through-holes is to perform a surface treatment with the through-holes from the second surface so as to form a conductive layer in the through-holes.

In one embodiment, each of the sub-matrix circuits further comprises at least one scan line and at least one data line, and the thin-film transistor is electrically connected with the scan line and the data line.

In one embodiment, the functional chip comprises a photovoltaic chip, a thermoelectric chip, a piezoelectric chip, or a sensing chip.

In one embodiment, the manufacturing method further comprises: electrically connecting the conductive material to a driving circuit board, wherein the driving circuit board comprises at least one driving chip.

In one embodiment, the conductive material is electrically connected to the driving circuit board by SMT (surface mount technology) or ACP (anisotropic conductive paste) attachment.

In one embodiment, a material of the insulation substrate comprises glass, resin or ceramics.

To achieve the above objective, the disclosure also provides an electronic package unit cooperated with a driving circuit board. The electronic package unit comprises an insulation substrate, a sub-matrix circuit, at least a functional chip, and a protection layer. The insulation substrate has a first surface and a second surface opposite to the first surface, and comprises a plurality of through-holes. The sub-matrix circuit is disposed on the insulation substrate, and the sub-matrix circuit comprises at least one thin film transistor. The functional chip is disposed on the first surface, and the functional chip is electrically connected with the driving circuit board through the sub-matrix circuit and the through-holes. The protection layer is disposed on the first surface of the insulation substrate to cover the functional chip.

In one embodiment, a thickness of the insulation substrate is less than 50 μm, and a thickness of the thin-film transistor is less than 20 μm.

In one embodiment, a material of the insulation substrate comprises glass, resin or ceramics.

In one embodiment, the sub-matrix circuit further comprises at least one scan line and at least one data line, and the thin-film transistor is electrically connected with the scan line and the data line.

In one embodiment, the electronic package unit further comprises a plurality of functional chips, and the functional chips are electrically connected with the sub-matrix circuits to form a matrix circuit.

In one embodiment, the driving circuit board comprises at least a connection circuit, the connection circuit comprises a plurality of connection pads and a plurality of connection wires, and the connection pads and the connection wires are connected to the sub-matrix circuits in series.

In one embodiment, the driving circuit board comprises at least a connection circuit, the connection circuit comprises a plurality of connection pads and a plurality of connection wires, and the connection pads and the connection wires are connected to the sub-matrix circuits in series.

In one embodiment, the driving circuit board further comprises at least a driving chip electrically connected with the sub-matrix circuits of the electronic package units through the connection circuits.

In one embodiment, the functional chip comprises a photovoltaic chip, a thermoelectric chip, a piezoelectric chip, or a sensing chip.

In one embodiment, a side of the electronic package unit is greater than 50 μm.

To achieve the above objective, the present disclosure further provides an electronic device, which comprises a plurality of electronic package units and a driving circuit board. Each electronic package unit comprises an insulation substrate, at least a sub-matrix circuit, at least a functional chip, and a protection layer. The insulation substrate has a first surface and a second surface opposite to the first surface, and the insulation substrate comprises a plurality of through-holes. The sub-matrix circuit is disposed on the insulation substrate, and the sub-matrix circuit comprises at least one thin film transistor. The functional chip is disposed on the first surface of the insulation substrate. The protection layer is disposed on the first surface of the insulation substrate to cover the functional chip. The driving circuit board faces the second surface of the insulation substrate, and the functional chips are electrically connected to the driving circuit board through the sub-matrix circuits and the through-holes, respectively.

As mentioned above, the electronic package unit, manufacturing method thereof and electronic device of this disclosure are to pack a plurality of sub-matrix circuits and functional chips together through an insulation substrate and to electrically connect the functional chips to the second surface of the insulation substrate through the sub-matrix circuits and conductive material, thereby achieving the purpose of manufacturing a thin-film transistor substrate (electronic package unit) capable of being applied to various electronic devices. Therefore, according to this disclosure, it is unnecessary to design various thin-film processes for the electronic devices of different sizes or functions. Accordingly, the expensive TFT manufacturing processes, photomasks, substrates, and/or materials are not needed, so that the manufacturing cost can be lower. Besides, this disclosure is flexible and is suitable for the requirements of various products.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
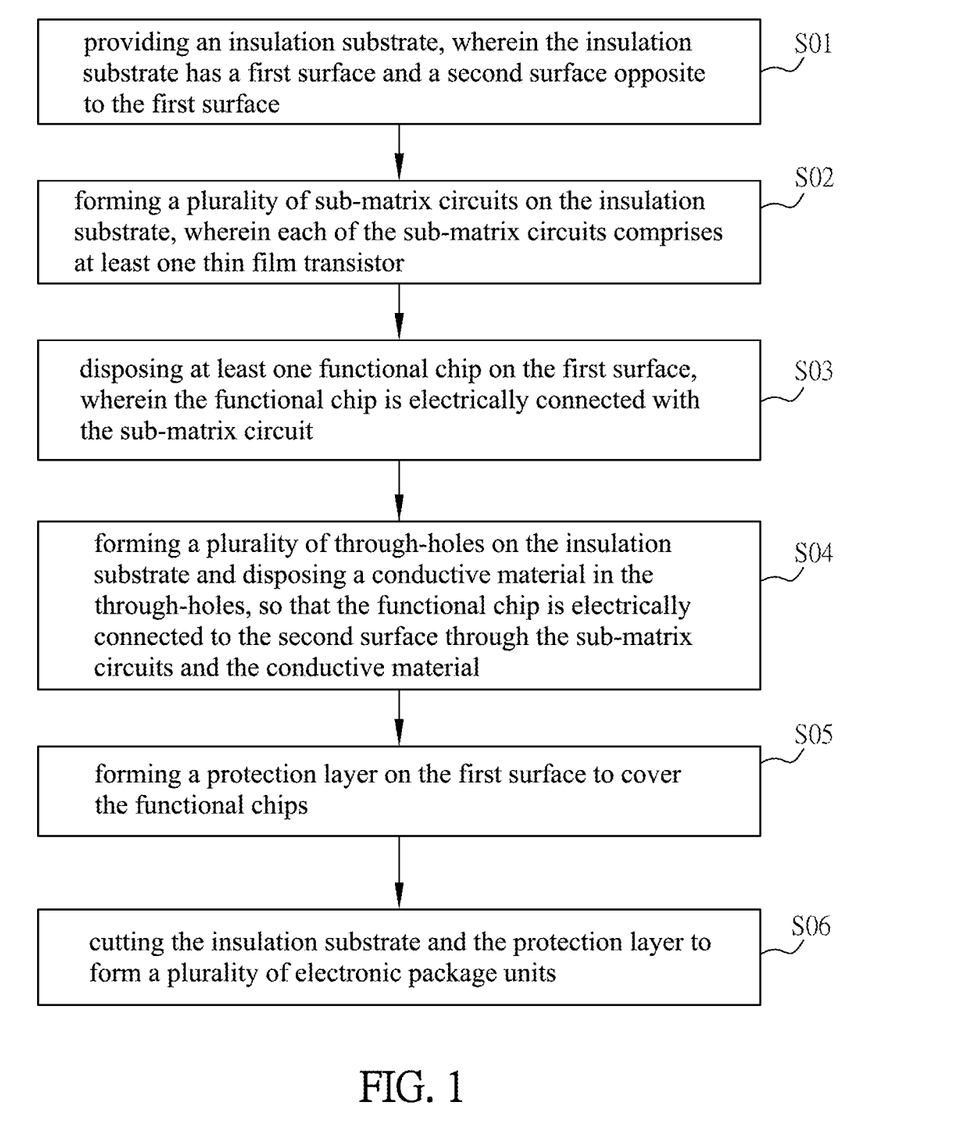
FIG. 1 is a flow chart showing a manufacturing method of electronic package units according to an embodiment of this disclosure.

FIG. 1 is a flow chart showing a manufacturing method of electronic package units according to an embodiment of this disclosure. As shown in FIG. 1, the manufacturing method of electronic package units comprises steps of: providing an insulation substrate, wherein the insulation substrate has a first surface and a second surface opposite to the first surface (step S01); forming a plurality of sub-matrix circuits on the insulation substrate, wherein each of the sub-matrix circuits comprises at least one thin film transistor (step S02); disposing at least one functional chip on the first surface, wherein the functional chip is electrically connected with the sub-matrix circuit (step S03); forming a plurality of through-holes on the insulation substrate and disposing a conductive material in the through-holes, so that the functional chip is electrically connected to the second surface through the sub-matrix circuits and the conductive material (step S04); forming a protection layer on the first surface to cover the functional chips (step S05); and cutting the insulation substrate and the protection layer to form a plurality of electronic package units (step S06). The insulation substrate can be a rigid substrate or a flexible substrate. In some embodiments, if the insulation substrate is a flexible substrate, the flexible substrate is formed on a rigid carrier plate (e.g. by providing an adhesive layer) in advance so as to easily perform the following processes to form the other components on the flexible substrate and to make the operation of the flexible substrate easier. Afterwards, the rigid carrier plate can be removed after finishing the following processes. If the insulation substrate is a rigid substrate, the rigid carrier plate is not needed. In addition, the order of the above steps S01 to S06 can be changed in different embodiments, which will be described in the following embodiments.

The above steps will be further described with reference to FIG. 1 in view of FIGS. 2A to 2F. FIGS. 2A to 2F are schematic diagrams showing the manufacturing procedure of the electronic package unit 1 according to an embodiment of this disclosure.

Figure 2A:
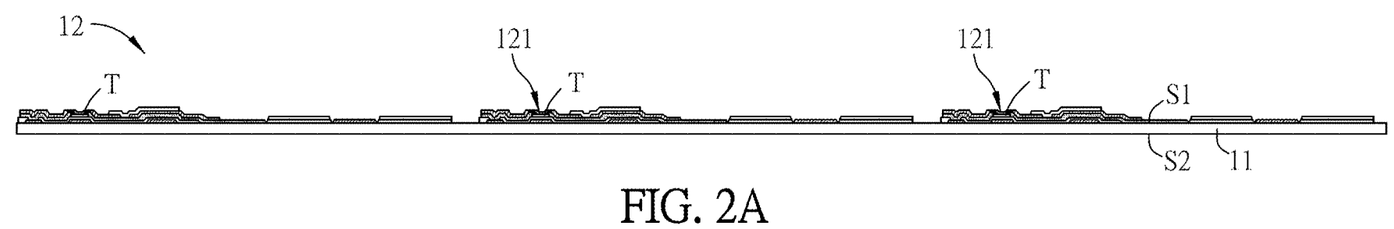
FIGS. 2A to 2F are schematic diagrams showing the manufacturing procedure of the electronic package unit according to an embodiment of this disclosure.

As shown in FIG. 2A, the step S01 is to provide an insulation substrate 11, wherein the insulation substrate 11 has a first surface S1 and a second surface S2 opposite to the first surface S1. The material of the insulation substrate 11 comprises glass, resin, metal, ceramics, or composite materials. Herein, the resin material is a flexible material, and may comprise organic polymer material. The glass transition temperature (Tg) of the organic polymer material is, for example, between 250° C. and 600° C., and preferably between 300° C. and 500° C. Since the organic polymer material has a relative higher glass transition temperature, the following thin-film processes can be performed to form the thin-film transistors and other components or wires. The organic polymer material can be a thermoplastic material, such as polyimide (PI), polyethylene (PE), polyvinylchloride (PVC), polystyrene (PS), acrylic, fluoropolymer, polyester, or nylon. In some embodiments, if the insulation substrate 11 is a flexible substrate, the PI material can be provided by adhesion or coating on a rigid carrier plater, and then cured (by thermal curing or light curing) to form a flexible substrate.

As shown in FIG. 2A, the step S02 is to form a plurality of sub-matrix circuits 121 on the insulation substrate 11, wherein each sub-matrix circuit 121 comprises at least one thin film transistor. Herein, the sub-matrix circuits 121 disposed on the insulation substrate 11 can be connected with each other or not. If the sub-matrix circuits 121 are not connected with each other, they are separately disposed on the insulation substrate 11. In addition, each sub-matrix circuit 121 further comprises intersected first and second wires. Moreover, the plurality of sub-matrix circuits 121 can define a matrix circuit 12. In this case, the sub-matrix circuit 121 can be a minimum unit of the matrix circuit 12 or their combination. Any amount of multiple sub-matrix circuits 121 can compose a matrix circuit 12, and the formed matrix circuit 12 can be rectangular, diamond, triangular, or other concave or convex polygons. Each sub-matrix circuit 121 may comprise at least one thin-film transistor T. In this embodiment, the thin-film transistor T is formed on the upper surface (the first surface S1) of the insulation substrate 11 by thin-film process. In other embodiments, the thin-film transistor T can be formed on the lower surface (the second surface S2) of the insulation substrate 11, and this disclosure is not limited. Except for the thin-film transistor T, the sub-matrix circuit 121 may comprise other thin-film components or wires, such as the thin-film resistors, capacitors, conductive layers, metal layers, first wires or second wires. In some embodiments, the thickness of the insulation substrate 11 is less than 50 μm, and the thickness of the thin-film transistor T is less than 20 μm. For example, the total thickness of the insulation substrate 11 and the matrix circuit 12 is less than 100 μm, so that the entire electronic package unit 1 can be bendable and flexible. The above-mentioned thin-film process can be a semiconductor manufacturing process, which comprises a low-temperature polycrystalline silicon (LTPS) process, an amorphous silicon (α-Si) process, or a metal oxide semiconductor process (e.g. IGZO), and this disclosure is not limited.

Figure 2B:
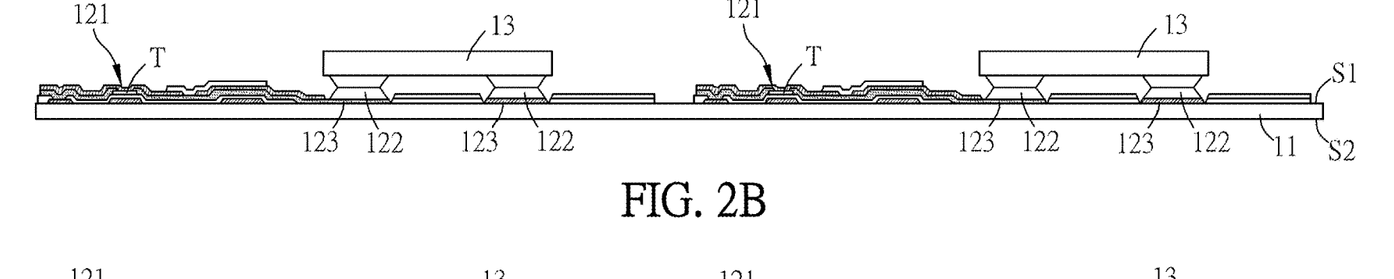

Afterwards, the electrical connection pads 122 are formed by, for example, printing process. In some embodiments, in order to facilitate the following chip packaging process, the substrate of FIG. 2A is cut into a proper size for fitting the packaging process machine after the step S02. Then, as shown in FIG. 2B, the step S03 is to dispose at least one functional chip 13 on the first surface S1 of the insulation substrate 11, wherein the functional chip 13 is electrically connected with the sub-matrix circuit 121. In this embodiment, the functional chip 13 can be formed on the first surface S1 of the insulation substrate 11 by wire bonding or flip-chip bonding, and electrically connected with the sub-matrix circuits 121. In some embodiments, the functional chip 13 can be a photovoltaic chip, a thermoelectric chip, a piezoelectric chip, or a sensing chip. Herein, the photovoltaic chip comprises, for example but not limited to, an LED chip, a micro LED chip, or any of other photovoltaic chips. The sensing chip comprises an IR sensing chip, an ultrasonic sensing chip, a temperature sensing chip, or an image sensor. When the functional chip 13 is a photovoltaic chip, thermoelectric chip or a piezoelectric chip, the controller disposed outside the matrix circuit 12 can control the ON/OFF of the functional chip 13 through the first wire, the second wire and the thin-film transistor T. When the functional chip 13 is a sensing chip, the detected data obtained by the functional chip 13 can be transmitted to an external device via the first wire, the second wire and the thin-film transistor T.

In addition, each sub-matrix circuit 121 of this embodiment further comprises at least one metal layer 123, which is disposed on the first surface S1 of the insulation substrate 11. At least one electrical connection pad 122 is formed on the metal layer 123 and connected to the metal layer 123, so that the functional chip 13 can be electrically connected with the metal layer 123 of the sub-matrix circuit 121 through the electrical connection pad 122. Herein, the functional chip 13 and the electrical connection pad 122 can be connected by wire bonding, flip-chip bonding, eutectic bonding (e.g. Au—Sn eutectic bonding), ACF (anisotropic conductive film) bonding, ACP (anisotropic conductive paste) bonding, solder ball bonding, or ultrasonic bonding, and this disclosure is not limited. In this embodiment, the functional chip 13 is a photovoltaic chip (e.g. LED), and the electrodes of the function chip 13 is disposed on the electrical connection pad 122 by flip-chip bonding. Thus, the functional chip 13 can be electrically connected to the thin-film transistor T through the electrical connection pad 122 and the metal layer 123. In some embodiments, the two electrodes of the functional chip 13 can be electrically connected with the electrical connection pad 122 and the metal layer 123, respectively, by the electrical conductive material (e.g. thermal melted material, solder ball or Au bump), or other materials such as Cu paste, Ag paste, ACP, or the likes. In some embodiments, the electrical connection pad 122 that is electrically connected with the two electrodes E1 and E2 (not shown) of the functional chip 13 can be, for example but not limited to, thickened Cu paste pad.

Figure 2C:
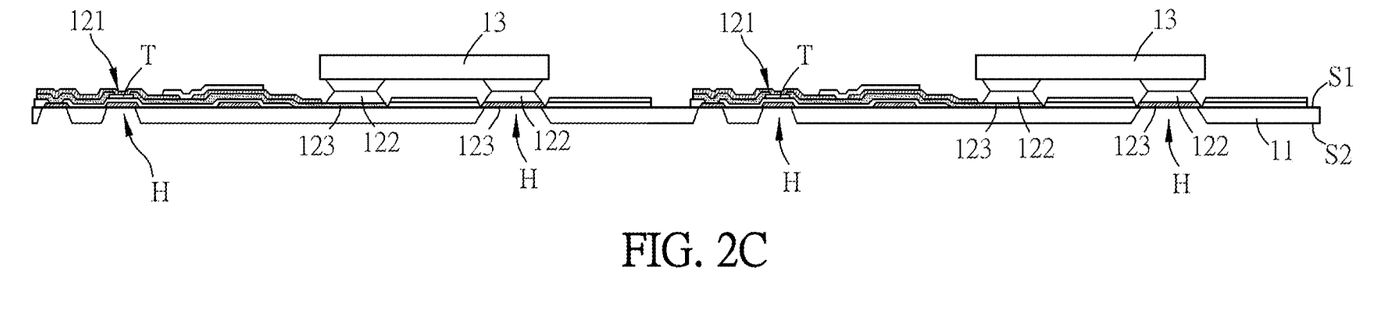
Figure 2D:
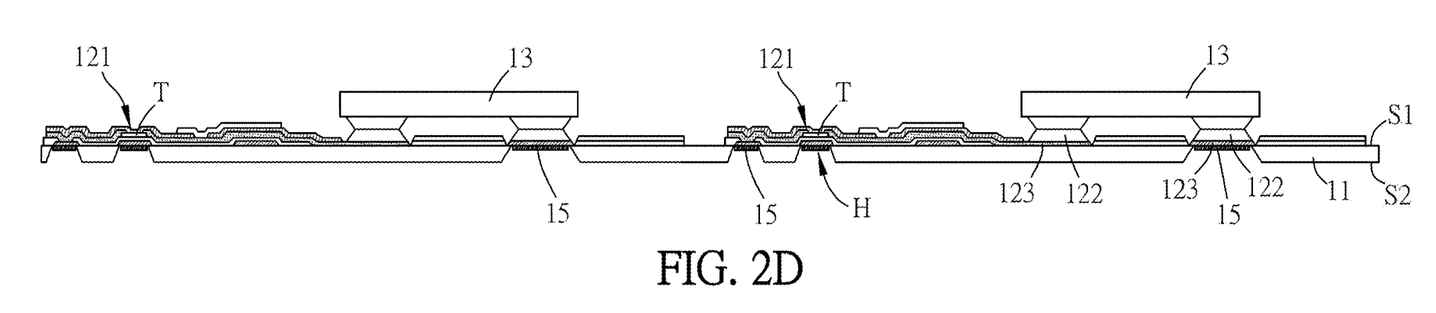

As shown in FIG. 2C, the step S04 is to form a plurality of through-holes H on the insulation substrate 11 and to dispose a conductive material (not shown) in the through-holes H, so that the functional chip 13 can be electrically connected to the second surface S2 through the sub-matrix circuits 121 and the conductive material. In details, a laser is provided to irradiate the insulation substrate 11 so as to form the plurality of through-holes H, which penetrate through the first surface S1 and the second surface S2. Herein, the laser can irradiate the first surface S1 of the insulation substrate 11 so as to form the through-holes H, thereby exposing a part of the metal layer 123. FIG. 2C shows that the laser is provided to irradiate the second surface S2 of the insulation substrate 11 so as to form the through-holes H. In this embodiment, one electrode of the function chip 13 and two electrodes of the thin-film transistor T (gate and source, or gate and drain) can be electrically connected to the second surface S2 through the conductive material filled in the through-holes H. Furthermore, in order to provide a good adhesion between the conductive material and the metal layer 123, in some embodiments as shown in FIG. 2D, a surface treatment process is performed on the metal layer 123 in the through-holes H from the second surface S2, so that a conductive layer 15 can be formed inside the through-holes H. This configuration can increase the bonding strength between the metal layer 123 and the conductive material. Accordingly, the functional chip 13 and the sub-matrix circuit 121 can be electrically connected to the second surface S2 (e.g. the connection pad disposed on the second surface S2) through the through-holes H and the conductive material disposed therein. In this embodiment, the surface treatment process can be chemical tin plating, chemical gold plating, and/or copper paste coating, and this disclosure is not limited. To be noted, in the step S04, if the through-holes H are formed from the second surface S2, and the insulation substrate 11 is made of the material of flexible substrate (e.g. PI), it is necessary to add a step of removing the rigid substrate before performing the drilling process to form the through-holes H.

Figure 2E:
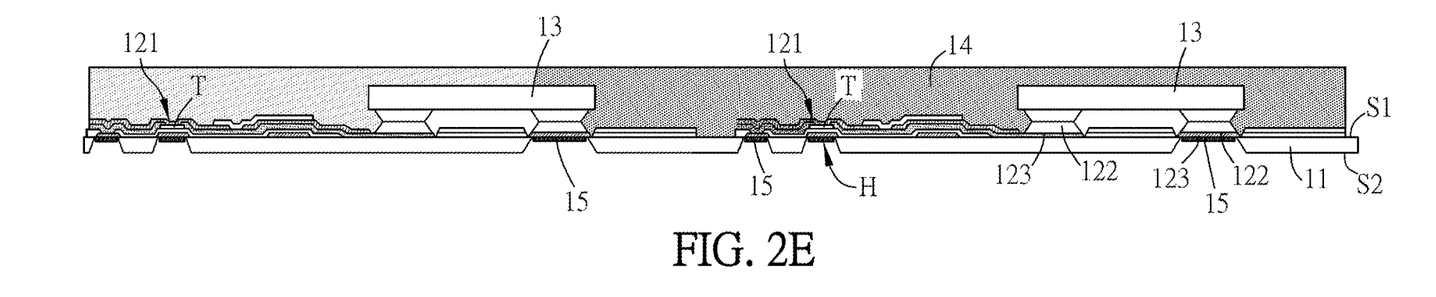

As shown in FIG. 2E, the step S05 is to form a protection layer 14 on the first surface S1 of the insulation substrate 11 to cover the functional chips 13. In this embodiment, the protection layer 14 can be formed by resin transfer molding or sealant dispensing to cover the functional chips 13. Except for covering the functional chips 13, the protection layer 14 of this embodiment can also cover at least a part of the sub-matrix circuits 121. Accordingly, the configuration of the protection layer 14 can protect the sub-matrix circuits 121 and the functional chips 13 from being damaged by the external dusts or moisture.

To be noted, in the above-mentioned steps S03 to S05, if the through-holes H are formed from the second surface S2, the step S05 of forming the protection layer 14 can be performed after the step S03 of disposing the functional chip 13 and before the step S04 of forming the through-holes H and disposing the conductive material. Alternatively, if the through-holes H are formed from the first surface S1, the step S03 of disposing the functional chip 13 can be performed before the step S05 of forming the protection layer 14 and after the step S04 of forming the through-holes H and disposing the conductive material.

Figure 2F:
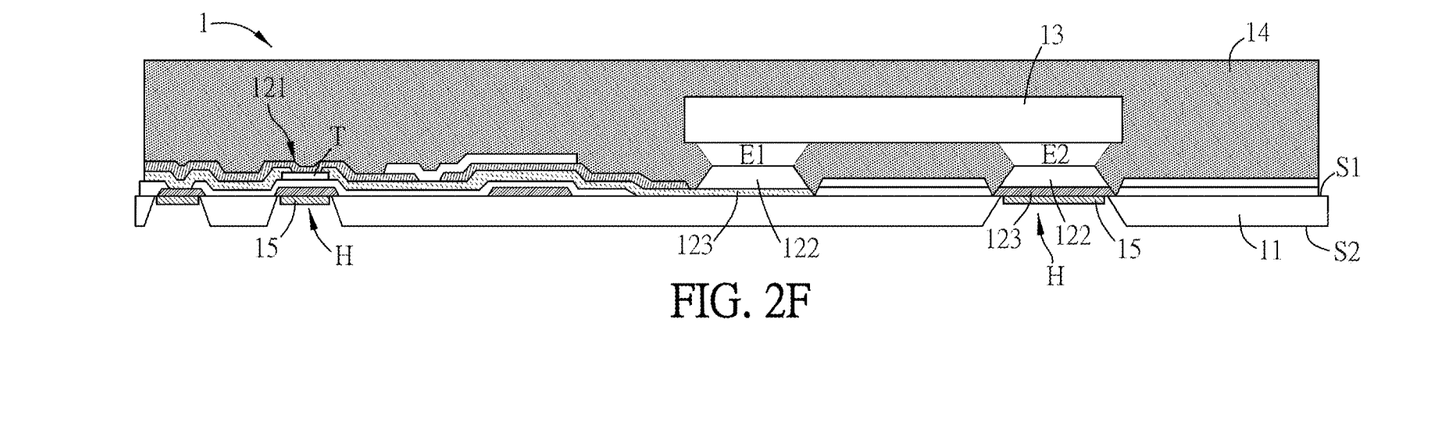

Finally, as shown in FIG. 2F, the step S06 is to cut the insulation substrate 11 and the protection layer 14 to form a plurality of electronic package units 1. In some embodiments, the manufacturing method may further comprise a step of electrically connecting the conductive material to a driving circuit board (not shown). Herein, the conductive material can be electrically connected to the driving circuit board by SMT (surface mount technology) or ACP (anisotropic conductive paste) attachment. The driving circuit board comprises at least one driving chip and a connection circuit, and the driving chip can drive the functional chip 13 through the connection circuit, the connection pad, the conductive material and the sub-matrix circuit 121.

Figure 3A:
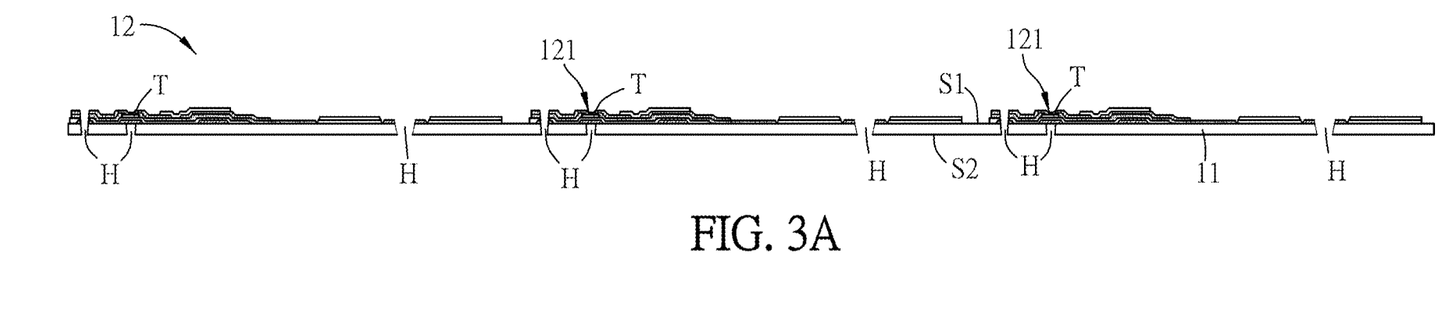
FIGS. 3A to 3C are schematic diagrams showing manufacturing procedure of the electronic package unit according to another embodiment of this disclosure.
Figure 3B:
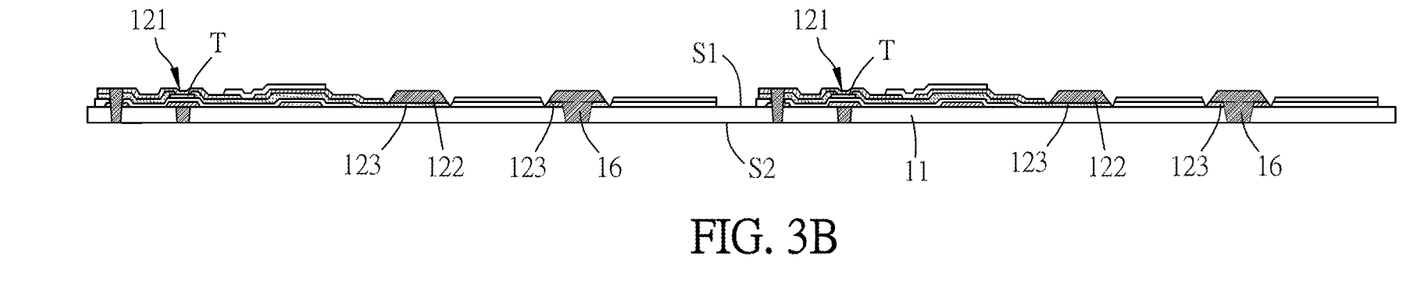
Figure 3C:
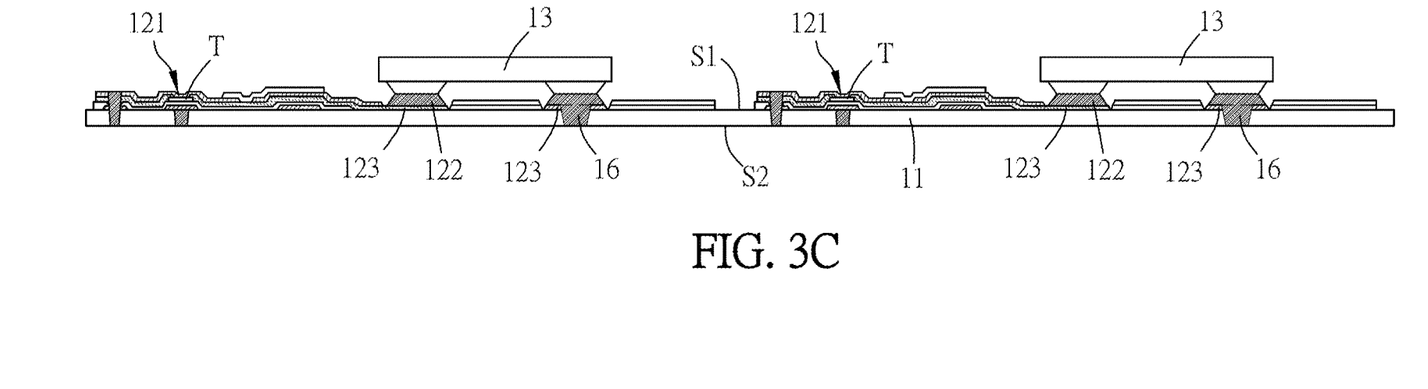

FIGS. 3A to 3C are schematic diagrams showing manufacturing procedure of the electronic package unit according to another embodiment of this disclosure.

In this embodiment, after finishing the above-mentioned steps S01 and S02, as shown in FIG. 3A, a laser is provided to irradiate the insulation substrate 11 from the first surface S1 so as to form the through-holes H. Afterwards, as shown in FIG. 3B, a conductive material 16 is provided to fill the through-holes H from the first surface S1, so that the functional chips 13 can be electrically connected to the second surface S2 through the sub-matrix circuit 121 and the conductive material 16. Herein, the conductive material 16 can be, for example but not limited to, formed by curing Cu paste, Au paste, tin paste, or ACP. If the conductive material 16 is Cu paste, the Cu paste can be filled in the through-holes H and partially exposed from the first surface S1 of the insulation substrate 11, thereby directly forming the electrical connection pad 122 on the first surface S1 of the insulation substrate 11. Accordingly, as shown in FIG. 3C, the functional chip 13 and the sub-matrix circuit 121 can be electrically connected to the second surface S2 through the electrical connection pad 122 and the conductive material 16 inside the through-holes H. Of course, the electrical connection pad 122 can also be formed on the conductive material 16 by an additional printing process, and this disclosure is not limited. In addition, if the conductive material 16 (e.g. Cu paste) is filled in the through-holes H from the first surface S1 and is partially disposed on the second surface S2, the part of the conductive material 16 exposed from the second surface S2 can be processed by a surface treatment to prevent the oxidation of the exposed conductive material 16. Moreover, if the insulation substrate 11 is a flexible substrate, the through-holes H are formed from the first surface S1, and the conductive material 16 is filled from the first surface S1, the rigid substrate can be removed before the surface treatment of the conductive material 16 or after the step S05 of disposing the protection layer 14.

Figure 4A:
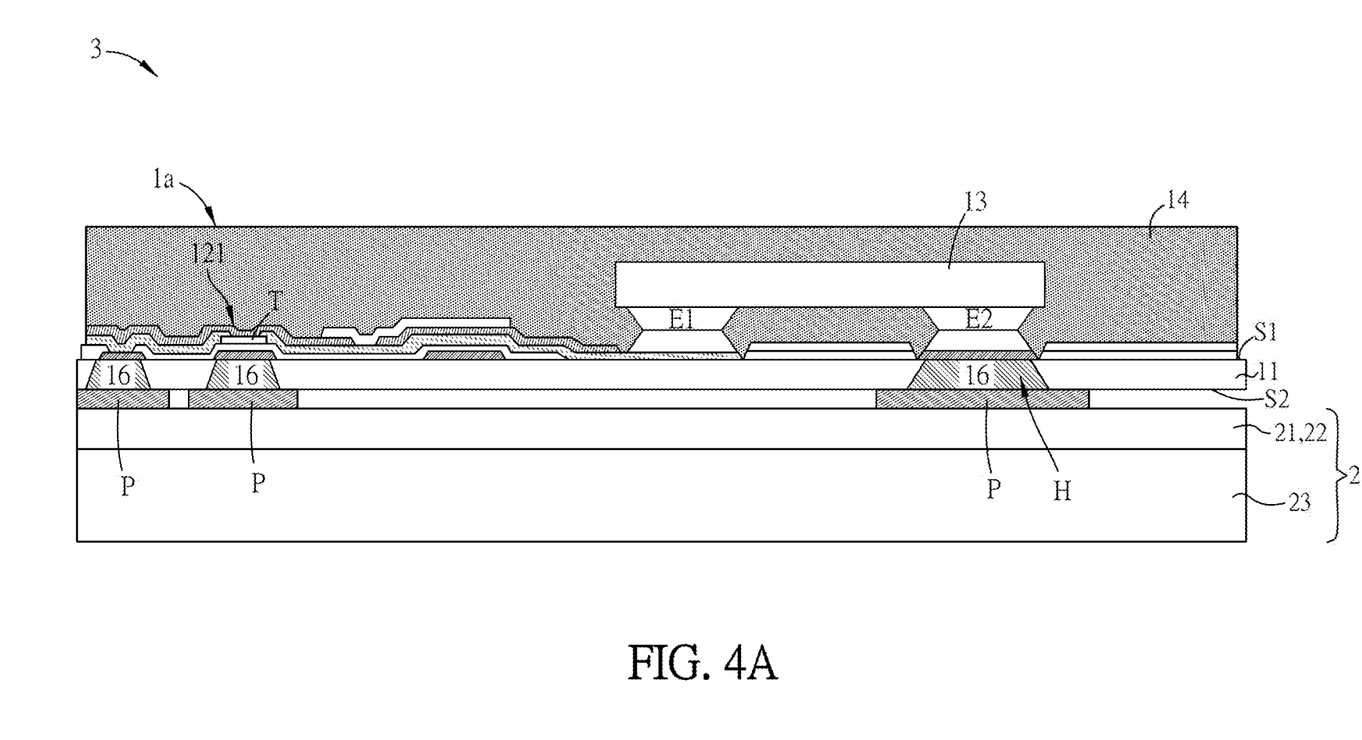
FIG. 4A is a schematic diagram showing the electronic package units according to an embodiment of this disclosure cooperated with a driving circuit board.

FIG. 4A is a schematic diagram showing an electronic package unit 1a according to an embodiment of this disclosure cooperated with a driving circuit board 2. An electronic device 3a includes the electronic package unit 1a and the driving circuit board 2. The electronic package unit 1a of this embodiment can be cooperated with a driving circuit board 2. The electronic package unit 1a comprises an insulation substrate 11, at least one sub-matrix circuit 121, at least one functional chip 13, and a protection layer 14. The insulation substrate 11 has a first surface Si and a second surface S2 opposite to the first surface S1, and comprises a plurality of through-holes H. The sub-matrix circuit 121 is disposed on the first surface S1 of the insulation substrate 11, and the sub-matrix circuit 121 comprises at least one thin film transistor T. The functional chip 13 is disposed on the first surface S1, and the functional chip 13 is electrically connected with the driving circuit board 2 through the sub-matrix circuit 121 and the through-holes H. The protection layer 14 is disposed on the first surface Si of the insulation substrate 11 to cover the functional chip 13 and the sub-matrix circuit 121. In addition, the other technical features of the electronic package unit 1a can be referred to the above-mentioned electronic package unit 1, so the detailed description thereof will be omitted.

In some embodiments, a side of the electronic package unit 1a is greater than 50 μm. In some embodiment, a side of the electronic package unit is between 400 μm and 600 μm. In some embodiments, the electronic package unit 1a comprises a plurality of thin-film transistors T. In some embodiments, the electronic package unit 1a comprises a plurality of functional chips 13. That is, one package unit comprises a plurality of functional chips 13 or a plurality of thin-film transistors T. In addition, the sub-matrix circuits 121 electrically connected with the functional chips 13 can form a matrix circuit. In some embodiments, the plurality of sub-matrix circuits 121 of multiple electronic package units 1a can form a single matrix circuit. In this embodiment, the matrix circuit is electrically connected with the driving circuit board 2, so that the driving circuit board 2 can drive the functional chips 13 in the matrix circuit of the electronic package units 1a. Moreover, the driving circuit board 2 can be a flexible circuit board or a rigid circuit board, and this disclosure is not limited.

In this embodiment, the driving circuit board 2 faces toward the second surface S2 of the insulation substrate 11, and the functional chips 13 can be electrically connected to the driving circuit board 2 through the sub-matrix circuits 121, the through-holes H and the connection pads P. Thus, the driving circuit board 2 can drive the electronic package unit 1a. Herein, the through-holes H are filled with the conductive material 16 (e.g. Cu paste, Ag paste, tin paste, or ACP), so that the driving circuit board 2 can be electrically connected with the functional chips 13 and the sub-matrix circuits 121 through the connection pads P and the conductive material 16 inside the through-holes H. In some embodiments, the conductive material 16 can be disposed by SMT (surface mount technology) or ACP (anisotropic conductive paste) attachment, and thus electrically connected with the driving circuit board 2. In some embodiments, the connection pads P can be formed by cuing a part of the conductive material 16 (e.g. Cu paste), which is filled in the through-holes H and exposed from the second surface S2 of the insulation substrate 11. In other words, the connection pads P and the conductive material 16 are made of the same material.

Figure 4B:
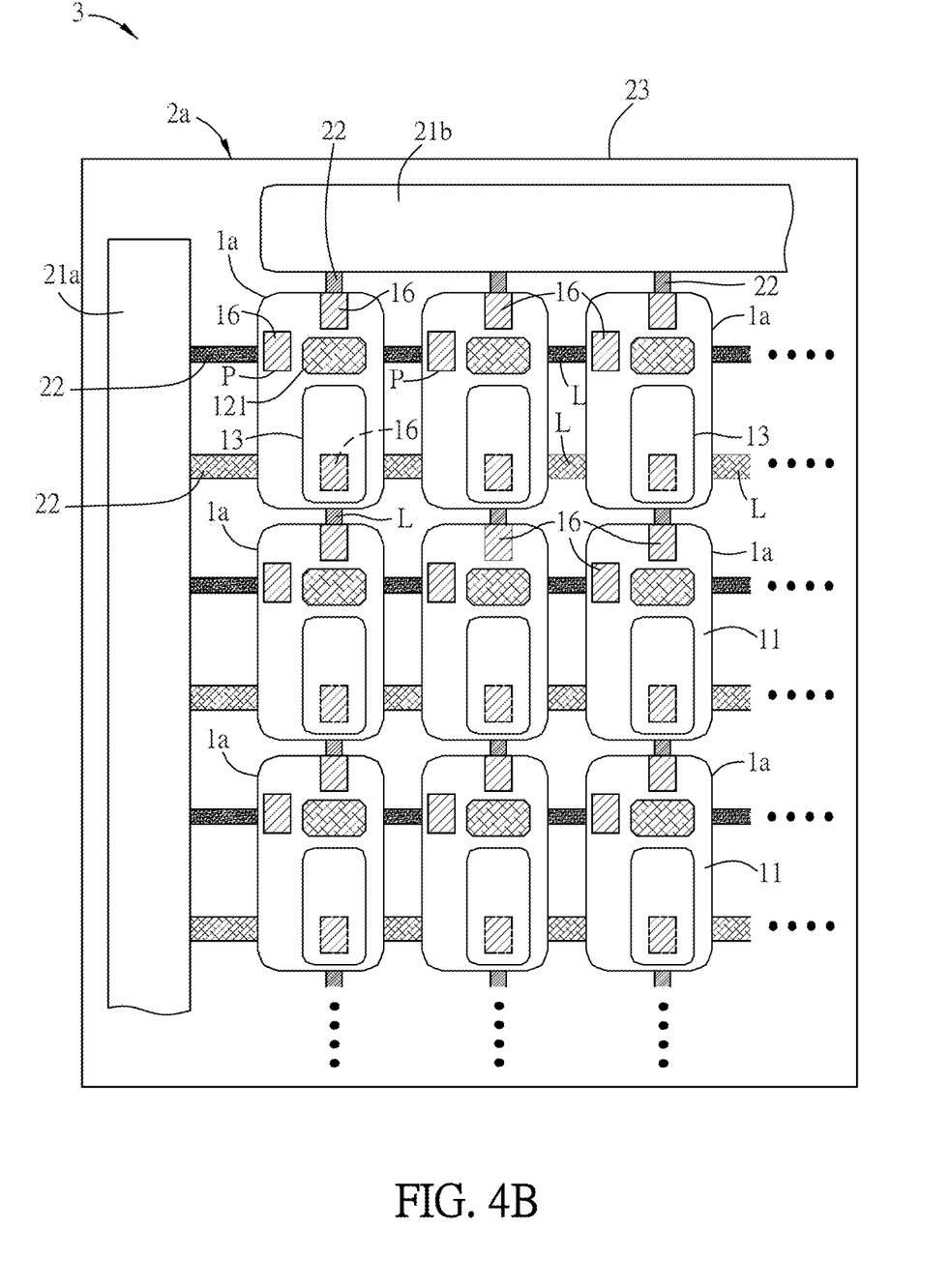
FIG. 4B is a top view of the driving circuit board and a plurality of electronic package units according to an embodiment of this disclosure.

FIG. 4B is a top view of a driving circuit board 2*a* and a plurality of electronic package units 1*a* according to an embodiment of this disclosure. An electronic device 3*b* includes the electronic package unit 1*a* and the driving circuit board 2*a*. In this embodiment, the driving circuit board 2*a* comprises at least one driving chip (two driving chips 21*a* and 21*b* are shown in FIG. 4B), at least one connection circuit 22 (multiple connection circuits 22 are shown in FIG. 4B), and a substrate 23. The substrate 23 can be a flexible substrate or a rigid substrate, and the driving chips 21*a* and 21*b*, and the connection circuits 22 are disposed on the substrate 23 and facing the second surface S2 of the insulation substrate 11.

A plurality of electronic package units 1*a* are separately disposed on the driving circuit board 2*a* and electrically connected with the driving circuit board 2*a*. To be noted, the electronic package units 1*a* can be arranged in a column, a row, an array (columns and rows), a polygonal, or an irregular shape according to the requirement of clients. In this embodiment, the electronic package units 1*a* are arranged in an array (columns and rows) so as to form an AM (active matrix) electronic device, such as, for example but not limited to, an AM LED display, an AM microLED display, an AM sensor array, an AM antenna array, an AM laser array, an AM projector array, or an AM millimeter-wave radar array.

In some embodiments, the connection circuit 22 comprises a plurality of connection pads P and a plurality of wires L, and the connection pads P and the connection wires L are connected to the sub-matrix circuits 121 of the electronic package units 1*a* in series. The functional chip 13 of each electronic package unit 1*a* is electrically connected to the corresponding driving chip 21*a* or 21*b* of the driving circuit board 2*a* through the sub-matrix circuit 121, the through-holes H, the connection pads P and the corresponding wire L (the connection circuit 22). Accordingly, the driving circuit board 2*a* can individually drive the electronic package units 1*a* or receive the sensing data from the electronic package units 1*a*. In some embodiments, the driving chip 21*a* can be, for example but not limited to, a scan driving chip, and the driving chip 21*b* can be, for example but not limited to, a data driving chip. The driving chips 21*a* and 21*b* can drive the corresponding electronic package units 1*a*, respectively, through the corresponding connection circuit 22. In this embodiment, the connection circuit 22 of the driving circuit board 2*a* is shown as the two dimensional dotted lines. The wires L of the connection circuit 22 are multiple two dimensional dotted lines, which are arranged in horizontal and in vertical and are not electrically connected with each other. After disposing the electronic package unit 1*a* having the sub-matrix circuit 121 on the wires L, the matrix electronic device with higher design freedom in area and shape can be manufactured. In other words, the manufacturer can design the size of the needed driving circuit board 2*a*, and then dispose the electronic package unit 1*a* on the driving circuit board 2*a*, thereby finishing the manufacturing of the electronic device. The technical features of the electronic package unit 1*a* and the driving circuit board 2*a* can be referred to the above embodiment, so the detailed description thereof will be omitted.

Figure 5A:
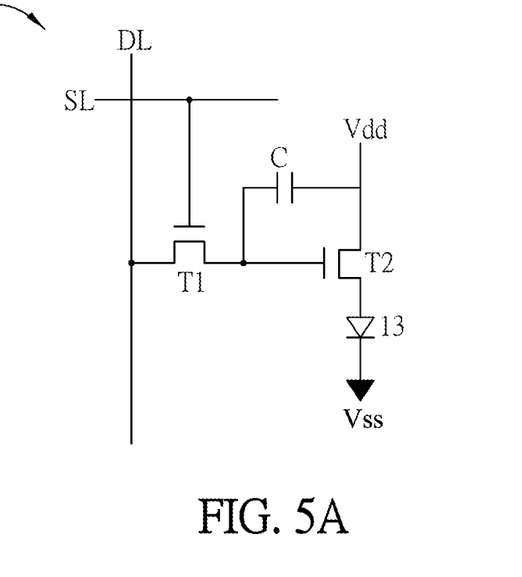
FIGS. 5A and 5B are a circuit diagram and a layout diagram of an electronic package unit according to another embodiment of this disclosure.
Figure 5B:
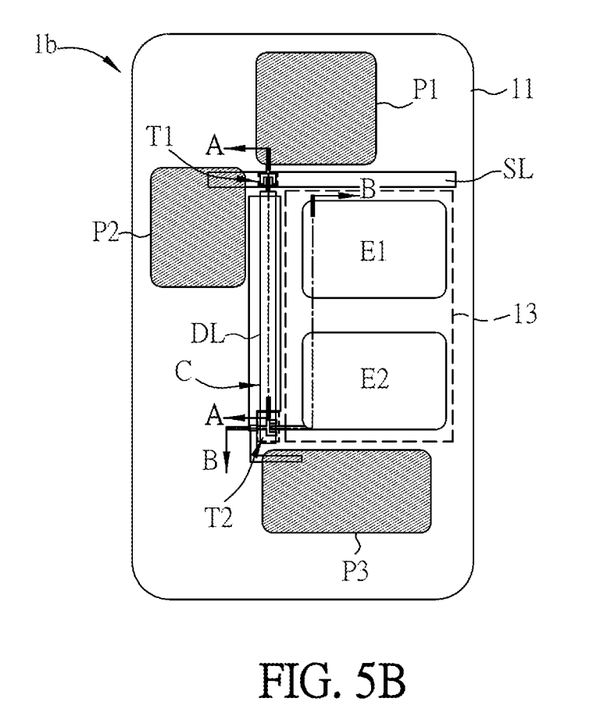
Figure 6A:
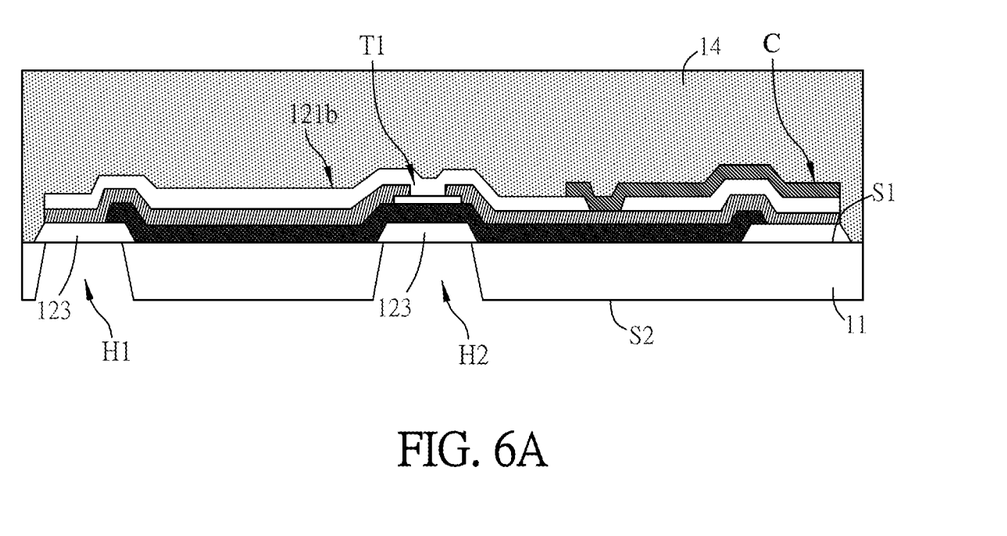
FIGS. 6A and 6B are sectional views of the electronic package unit of FIG. 5B along the line A-A and the line B-B.
Figure 6B:
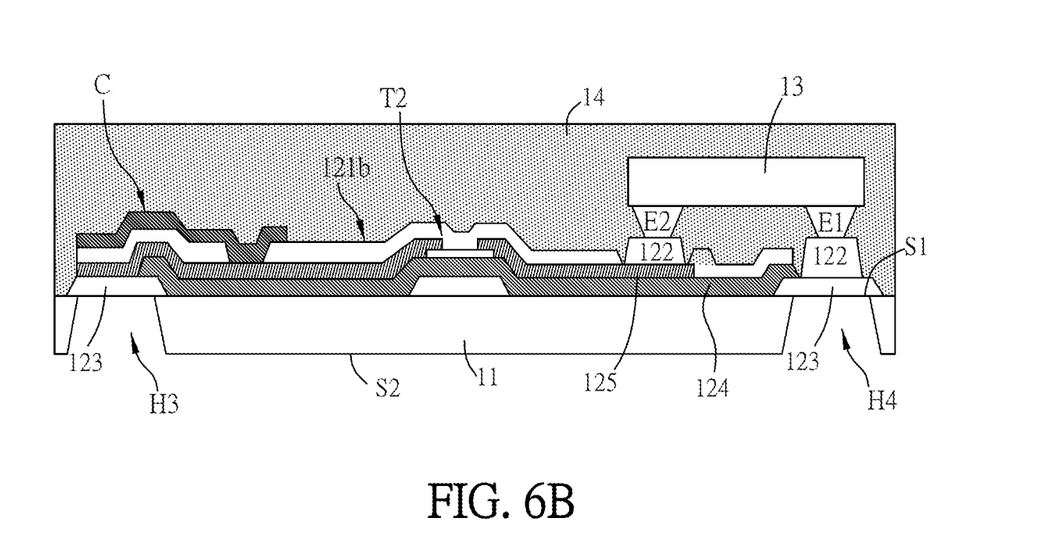

FIGS. 5A and 5B are a circuit diagram and a layout diagram of an electronic package unit 1*b* according to another embodiment of this disclosure. FIGS. 6A and 6B are sectional views of the electronic package unit of FIG. 5B along the line A-A and the line B-B. The circuit of the electronic package unit 1*b* of FIG. 5A is a 2T1C type circuit for example.

As shown in FIGS. 5A and 5B, in this embodiment, the sub-matrix circuit 121*b* (FIG. 6A) of the electronic package unit 1*b* comprises two thin-film transistors T1 and T2, at least one scan line SL, at least one data line DL, and a capacitor C. The thin-film transistors T1 and T2 are electrically connected to the scan line SL and the data line DL, respectively. In this embodiment, the functional chip 13 is, for example, an LED (shown by the dotted block). The component connection of the electronic package unit 1*b* can be referred to the circuit shown in FIG. 5A, so the detailed description thereof will be omitted. In addition, a driving circuit board (not shown) can be provided to face the second surface S2 of the insulation substrate 11 of the electronic package unit 1*b*, and the functional chips 13 can be electrically connected with the driving circuit board through the sub-matrix circuits 121*b* and the through holes H. Thus, the driving circuit board can drive the electronic package unit 1*b* via the connection pads P.

As shown in FIG. 5B, the connection pads P comprise a connection pad P1 for coupling to the data signal (data line DL), a connection pad P2 for coupling to the scan signal (scan line SL), and a connection pad P3 for coupling to the voltage signal (Vdd). To be noted, in the step of forming the through-holes H, the insulation substrate 11 needs a certain surface for performing the drilling process. The drilling process only forms the through-hole on the insulation substrate 11, and the connection pad disposed on the first surface S1 is not damaged by the drilling process. Accordingly, the conductive material can be filled in the through-holes to provide the conductive function after the drilling process. In addition, if the filled conductive material is Cu paste, the filled Cu paste can be exposed from the first surface S1 and the second surface S2 of the insulation substrate 11, thereby directly forming the connection pads on the first surface S1 and the second surface S2 of the insulation substrate 11 (e.g. the aspect of FIG. 5B). In this case, the driving area can be smaller than or equal to the size of the connection pad on the first surface S1. In addition, the size of the connection pad (made of Cu paste) formed on the second surface S2 can be smaller than, equal to, or larger than the size of the connection pad P on the first surface S1. This disclosure is not limited.

As shown in FIGS. 5B, 6A and 6B, the scan signal can be coupled to the gate (metal layer 123) of the thin-film transistor T1 through the connection pad (not shown) on the second surface S2 and the through-hole H2 (and the connection pad P2), and the data signal can be coupled to the drain (or source) of the thin-film transistor T1 through the connection pad (not shown) on the second surface S2 and the through-hole H1 (and the connection pad P1). The voltage signal Vdd can be coupled to the metal layer 123 and the drain (or source) of the thin-film transistor T2 through the connection pad (not shown) on the second surface S2 and the through-hole H3 (and the connection pad P3), and the other voltage signal Vss (e.g. ground voltage) can be coupled to the metal layer 123 and the electrode E1 of the functional chip 13 through the connection pad (not shown) on the second surface S2 and the through-hole H4. In addition, the other technical features of the electronic package unit 1b can be referred to the above-mentioned electronic package unit 1 or 1a, so the detailed description thereof will be omitted.

Figure 6C:
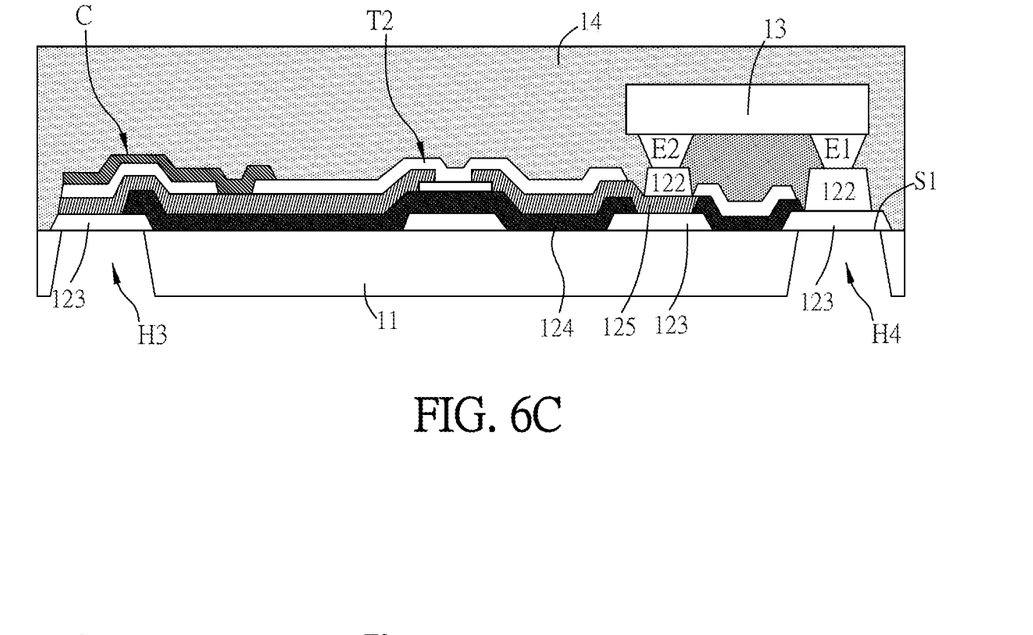
FIGS. 6C and 6D are sectional views of the electronic package units of different aspects along the line B-B.
Figure 6D:
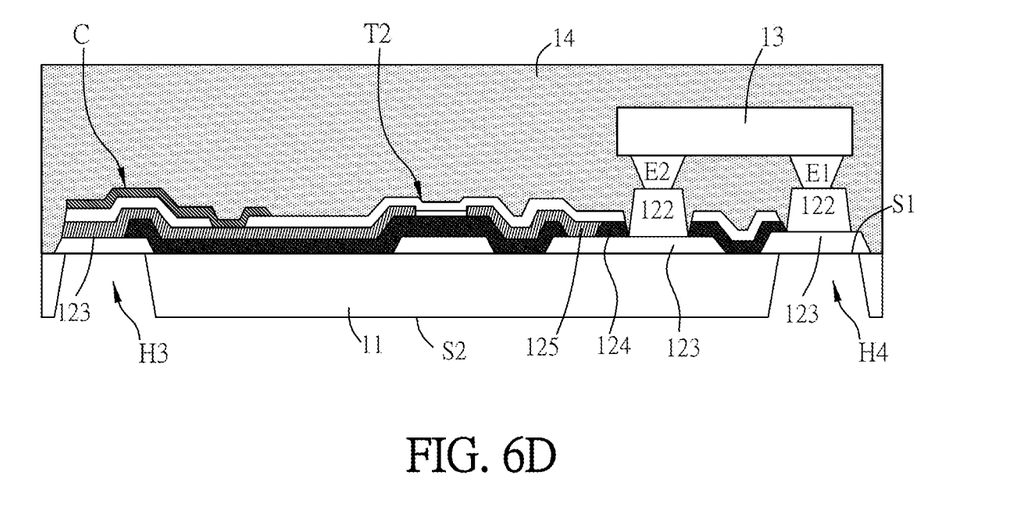

FIGS. 6C and 6D are sectional views of the electronic package units (as shown in FIG. 5B) of different aspects along the line B-B.

As shown in FIG. 6B, the sub-matrix circuit 121b electrically connected to the electrode E2 of the functional chip 13 is formed on the first surface S1 of the insulation substrate 11 and comprises an insulation layer 124, a metal layer 125 (the source or drain of the thin-film transistor T2) and the electrical connection pad 122 in order. As shown in FIG. 6C, the sub-matrix circuit electrically connected to the electrode E2 of the functional chip 13 is formed on the first surface S1 of the insulation substrate 11 and comprises a metal layer 123, a metal layer 125 (the source or drain of the thin-film transistor T2) and the electrical connection pad 122 in order. The insulation layer 124 comprises through-holes, and the metal layer 125 is disposed inside the through-holes. In addition, as shown in FIG. 6D, the sub-matrix circuit electrically connected to the electrode E2 of the functional chip 13 is formed on the first surface S1 of the insulation substrate 11 and comprises a metal layer 123 and the electrical connection pad 122 in order. The insulation layer 124 comprises through-holes, and the electrical connection pad 122 is disposed inside the through-holes. Besides, the source or drain (the metal layer 125) of the thin-film transistor T2 is electrically connected with the electrical connection pad 122 and the electrode E2 of the functional chip 13 through the metal layer 123.

Figure 7:
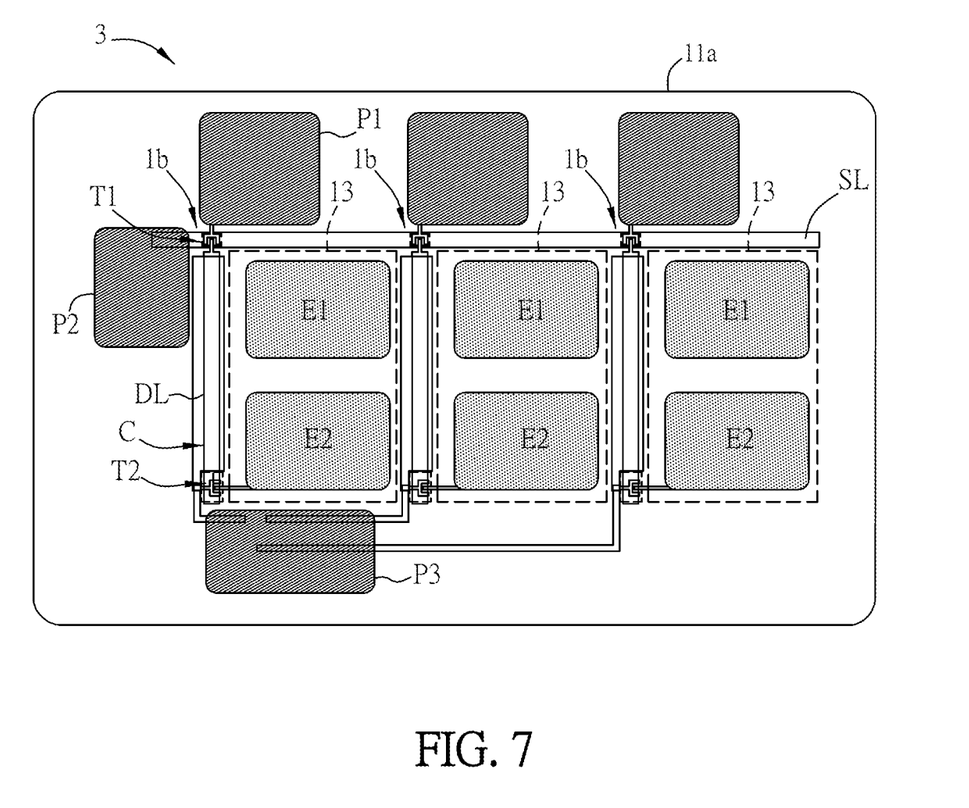
FIG. 7 is a layout diagram of an electronic device according to an embodiment of this disclosure.

FIG. 7 is a layout diagram of an electronic device 3 according to an embodiment of this disclosure. As shown in FIG. 7, the electronic device 3 of this embodiment comprises three electronic package units 1b (shown as the dotted blocks) and one driving circuit board (not shown, referring to the driving circuit board 2a of FIG. 4B). In this embodiment, the driving circuit board faces toward the second surface of the insulation substrate 11a, and the functional chips 13 are electrically connected to the driving circuit board through the sub-matrix circuit and the conductive material inside the through-holes. Thus, the driving circuit board can drive the electronic package units 1b. The driving circuit board may comprise all technical features of the above-mentioned driving circuit board 2 or 2a. The technical features of the driving circuit boards 2 and 2a and the electronic package unit 1b can be referred to the above embodiments, so the detailed descriptions thereof will be omitted.

In some embodiments, the three electronic package units 1b of the electronic device 3 can be three sub-pixels, and the three functional chips 13 in the three sub-pixels can be a red LED, a blue LED and a green LED, which can form a full-color pixel unit. Accordingly, the electronic device 3 can be a full-color LED display, and the driving circuit board can drive the electronic package units 1b to display the image. Of course, in other embodiments, the electronic device may comprise less than or more than three electronic package units 1b, and this disclosure is not limited. Each electronic package unit 1b comprises a sub-matrix circuit, and a plurality of sub-matrix circuits can together form any size of AM matrix circuit on the driving circuit board and the corresponding function chip array for controlling the functional chips or receiving the signals from the functional chips.

As mentioned above, the electronic package units of this disclosure can be designed to construct a matrix circuit in any desired size according to the requirement of the electronic device product, so the application thereof is very flexible. In addition, the conventional electronic device utilizing the lead from for driving is the PM (passive matrix) device, so it needs more driving ICs. This disclosure utilizes a plurality of electronic package units to construct an AM electronic device, so that it requires less driving ICs under the same resolution. Thus, the manufacturing cost of this disclosure is lower. In some embodiments, if the electronic device is an LED or microLED backlight source, it can also provide the local dimming function.

Furthermore, regarding the conventional approach of utilizing the thin-film transistor to drive the photoelectric element (for example, utilizing the thin-film transistor on a TFT substrate to drive an OLED to emit light), it is necessary to design expensive TFT manufacturing processes, photomasks, substrates, and materials for the products of different sizes or functions, which is not benefit to the requirements for various products. This disclosure provides an approach to divide the matrix circuit into a plurality of sub-matrix circuits and to package the sub-matrix circuits with functional chips, so that one kind of TFT substrate (electronic package unit) can be applied to various products. Thus, this disclosure can solve the problem of the conventional art. When applied to the displays with the same pixel area but different resolutions, the electronic package units of this disclosure can be arbitrarily combined. Compared with the display formed directly by the large substrate, this disclosure can save the total photomasks and thus reduce the manufacturing cost. In addition, the required total area of the TFT substrate (i.e. the sum of the area of the sub-matrix circuit substrates) is much smaller than that of the TFT matrix substrate used in the conventional art, and the cost of the electronic device can be further reduced. Therefore, when utilizing this disclosure to manufacture the large-sized electronic device, the large-sized substrate can have a better area utilization rate. In addition, different combinations of the electronic package units can be designed for various sized products, so that the TFT substrate can be well cut and fully utilized, thereby saving the manufacturing cost.

In summary, the electronic package unit, manufacturing method thereof and electronic device of this disclosure are to pack a plurality of sub-matrix circuits and functional chips together through an insulation substrate and to electrically connect the functional chips to the second surface of the insulation substrate through the sub-matrix circuits and conductive material, thereby achieving the purpose of manufacturing a thin-film transistor substrate (electronic package unit) capable of being applied to various electronic devices. Therefore, according to this disclosure, it is unnecessary to design various thin-film processes for the electronic devices of different sizes or functions. Accordingly, the expensive TFT manufacturing processes, photomasks, substrates, and/or materials are not needed, so that the manufacturing cost can be lower. Besides, this disclosure is flexible and is suitable for the requirements of various products.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A manufacturing method of electronic device, comprising:

providing an insulation substrate, wherein the insulation substrate has a first surface and a second surface opposite to the first surface;

forming a plurality of sub-matrix circuits directly on the insulation substrate, wherein each of the sub-matrix circuits comprises at least one thin film transistor;

disposing at least one functional chip directly on the first surface, wherein the functional chip is electrically connected with the sub-matrix circuit;

forming a plurality of through-holes on the insulation substrate and disposing a conductive material in the through-holes, so that the functional chip is electrically connected to the second surface through the sub-matrix circuits and the conductive material;

forming a protection layer on the first surface to cover the functional chips;

cutting the insulation substrate and the protection layer to form a plurality of individual wrapping of the electronic package units; and electrically connecting the conductive material of the electronic package units to a driving circuit board, wherein the driving circuit board faces toward the second surfaces of the insulation substrates, and the functional chips are electrically connected to the driving circuit board through the sub-matrix circuits and conductive material inside the through-holes.

2. The manufacturing method according to claim 1, wherein the step of forming the through-holes is to provide a laser for irradiating the insulation substrate so as to form the through-holes on the insulation substrate.

3. The manufacturing method according to claim 1, wherein the step of disposing the conductive material in the through-holes is to perform a surface treatment with the through-holes from the second surface so as to form a conductive layer in the through-holes.

4. The manufacturing method according to claim 1, wherein each of the sub-matrix circuits further comprises at least one scan line and at least one data line, and the thin-film transistor is electrically connected with the scan line and the data line.

5. The manufacturing method according to claim 1, wherein the functional chip comprises a photovoltaic chip, a thermoelectric chip, a piezoelectric chip, or a sensing chip.

6. The manufacturing method according to claim 1, wherein the driving circuit board comprises at least one driving chip.

7. The manufacturing method according to claim 6, wherein the conductive material is electrically connected to the driving circuit board by SMT (surface mount technology) or ACP (anisotropic conductive paste) attachment.

8. The manufacturing method according to claim 1, wherein a material of the insulation substrate comprises glass, resin or ceramics.

9. An electronic device comprising:
a driving circuit board; and
a plurality of individual wrapping of electronic package units disposed on the driving circuit board, and each of the electronic package units comprising:
an insulation substrate having a first surface and a second surface opposite to the first surface, wherein the insulation substrate comprises a plurality of through-holes;
a sub-matrix circuit disposed on the insulation substrate, wherein the sub-matrix circuit comprises at least one thin film transistor;
at least a functional chip disposed on the first surface, wherein the functional chip is electrically connected with the driving circuit board through the sub-matrix circuit and the through-holes, and the sub-matrix circuit and the functional chip are disposed directly on the insulation substrate; and
a protection layer disposed on the first surface of the insulation substrate to cover the functional chip;
wherein the driving circuit board faces toward the second surfaces of the insulation substrates, and the functional chips are electrically connected to the driving circuit board through the sub-matrix circuits and conductive material inside the through-holes.

10. The electronic device according to claim 9, wherein a thickness of the insulation substrate is less than 50 µm, and a thickness of the thin-film transistor is less than 20 µm.

11. The electronic device according to claim 9, wherein a material of the insulation substrate comprises glass, resin or ceramics.

12. The electronic device according to claim 9, wherein the sub-matrix circuit further comprises at least one scan line and at least one data line, and the thin-film transistor is electrically connected with the scan line and the data line.

13. The electronic device according to claim 9, further comprising:
a plurality of functional chips, wherein the functional chips are electrically connected with the sub-matrix circuits to form a matrix circuit.

14. The electronic device according to claim 13, wherein the driving circuit board comprises at least a connection circuit, the connection circuit comprises a plurality of connection pads and a plurality of connection wires, and the connection pads and the connection wires are connected to the sub-matrix circuits in series.

15. The electronic device according to claim 9, wherein the sub-matrix circuits of the plurality of individual wrapping of the electronic package units form a matrix circuit.

16. The electronic device according to claim 15, wherein the driving circuit board comprises at least a connection circuit, the connection circuit comprises a plurality of connection pads and a plurality of connection wires, and the connection pads and the connection wires are connected to the sub-matrix circuits in series.

17. The electronic device according to claim 16, wherein the driving circuit board further comprises at least a driving chip electrically connected with the sub-matrix circuits of the plurality of individual wrapping of the electronic package units through the connection circuits.

18. The electronic device according to claim 9, wherein the functional chip comprises a photovoltaic chip, a thermoelectric chip, a piezoelectric chip, or a sensing chip.

19. The electronic device according to claim 9, wherein a side of one of the plurality of individual wrapping of the electronic package unit is greater than 50 µm.

20. An electronic device, comprising:
a plurality of individual wrapping of electronic package units, wherein each of the electronic package units comprises:
an insulation substrate having a first surface and a second surface opposite to the first surface, wherein the insulation substrate comprises a plurality of through-holes,
at least a sub-matrix circuit disposed on the insulation substrate, wherein the sub-matrix circuit comprises at least one thin film transistor,
at least a functional chip disposed on the first surface of the insulation substrate, wherein the sub-matrix circuit and the functional chip are disposed directly on the insulation substrate, and a protection layer disposed on the first surface of the insulation substrate to cover the functional chip; and
a driving circuit board facing the second surface of the insulation substrate, wherein the functional chips are electrically connected to the driving circuit board through the sub-matrix circuits and the through-holes, respectively.

\* \* \* \* \*